(12) United States Patent
Jeon

(10) Patent No.: US 9,042,192 B2
(45) Date of Patent: May 26, 2015

(54) SEMICONDUCTOR DEVICE AND SEMICONDUCTOR SYSTEM INCLUDING THE SAME

(75) Inventor: Byung Deuk Jeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 448 days.

(21) Appl. No.: 13/602,077

(22) Filed: Aug. 31, 2012

(65) Prior Publication Data
US 2013/0279269 A1 Oct. 24, 2013

(30) Foreign Application Priority Data

Apr. 20, 2012 (KR) .................... 10-2012-0041364

(51) Int. Cl.
*G11C 7/00* (2006.01)
*G11C 8/12* (2006.01)
*G11C 29/12* (2006.01)
*G11C 29/26* (2006.01)
*G11C 11/40* (2006.01)

(52) U.S. Cl.
CPC .... *G11C 8/12* (2013.01); *G11C 11/40* (2013.01); *G11C 29/1201* (2013.01); *G11C 29/26* (2013.01); *G11C 2029/2602* (2013.01)

(58) Field of Classification Search
CPC ............... G11C 29/1201; G11C 8/12; G11C 2029/2602; G11C 29/26; G11C 29/06
USPC ................ 365/189.02, 201, 185.13
See application file for complete search history.

(56) References Cited

U.S. PATENT DOCUMENTS

| 5,315,553 | A | * | 5/1994 | Morris | 365/201 |
| 5,574,692 | A | * | 11/1996 | Dierke | 365/201 |
| 6,327,197 | B1 | * | 12/2001 | Kim et al. | 365/200 |
| 8,542,546 | B2 | * | 9/2013 | Matsui et al. | 365/201 |
| 2010/0302841 | A1 | * | 12/2010 | Kim et al. | 365/163 |
| 2011/0156738 | A1 | * | 6/2011 | Jeon et al. | 324/755.01 |
| 2012/0057411 | A1 | * | 3/2012 | Koeppe et al. | 365/189.02 |
| 2012/0195113 | A1 | * | 8/2012 | Yoon et al. | 365/163 |
| 2013/0002342 | A1 | * | 1/2013 | Jeon | 327/524 |

FOREIGN PATENT DOCUMENTS

KR  10-0496862 B1  6/2005
KR  10-2008-0069778 A  7/2008

* cited by examiner

*Primary Examiner* — Vanthu Nguyen
*Assistant Examiner* — Khamdan Alrobaie
(74) *Attorney, Agent, or Firm* — William Park & Associates Ltd.

(57) ABSTRACT

A semiconductor device includes two or more memory chips electrically coupled. Each of the memory chips includes global lines, a MUX unit, a selection unit, and an output unit. The global lines transmit data stored in memory cells. The MUX unit receives the data loaded onto the global lines to output a test data. The selection unit is inserted into two or more of the global lines and configured to output the test data instead of the data loaded onto the two or more global lines, in a test mode. The output unit is coupled to the global lines and is configured to output the data in a normal mode, and output the test data received from any one of the two or more global lines connected to the selection unit to an I/O pad based on information about the memory chip in a test mode.

20 Claims, 5 Drawing Sheets

SEMICONDUCTOR DEVICE AND SEMICONDUCTOR SYSTEM INCLUDING THE SAME

CROSS-REFERENCES TO RELATED APPLICATION

The present application claims priority under 35 U.S.C. §119(a) to Korean application number 10-2012-0041364 filed on Apr. 20, 2012, in the Korean Intellectual Property Office, which is incorporated by reference in its entirety.

BACKGROUND

1. Technical Field

The present invention relates to semiconductor design technology, and more particularly, to a semiconductor device capable of performing a memory test and a semiconductor system including the same.

2. Related Art

In general, a data read operation and a data write operation must be precisely performed in a semiconductor memory device, such as DRAM. To maintain precision, a failed memory cell should not exist in a memory chip. According to the tendency toward high integration of semiconductor technology, the number of memory cells integrated into one memory chip is increasing. Thus, the possibility that a failed memory cell may exist within a chip is increasing despite an advanced fabrication process. If this failed memory cell is not precisely tested, it may lead to deteriorated reliability in a semiconductor memory device.

In a test operation of a semiconductor memory device, if the test operation is performed for each memory cell, the time taken to test a high-integrated semiconductor memory device increases, resulting in increased costs. Accordingly, devices and methods for reducing the time taken to test a semiconductor memory device are desirable.

SUMMARY

In an embodiment of the present invention, a semiconductor device includes two or more memory chips electrically coupled. Each of the memory chips includes a plurality of global lines configured to transmit a plurality of data stored in memory cells, a MUX unit configured to receive the plurality of data loaded onto the plurality of global lines to output a test data, a selection unit inserted into two or more of the plurality of global lines and configured to output the test data instead of the data loaded onto the two or more global lines, in a test mode, and an output unit coupled to the plurality of global lines and configured to output the plurality of data in a normal mode, and to output the test data received from any one of the two or more global lines coupled to the selection unit based on information about the memory chip in the test mode.

In an embodiment of the present invention, a semiconductor device includes two or more memory chips electrically coupled. Each of the memory chips includes a plurality of global lines configured to transmit a plurality of data stored in memory cells, a MUX unit configured to receive the plurality of data loaded onto the plurality of global lines to output a test data, a selection unit inserted into two or more of the plurality of global lines and configured to output the test data instead of the data loaded onto the two or more global lines, in a test mode, a control unit configured to generate an output enable signal and two or more test output enable signals based on received chip information in response to a test mode signal, and an output unit configured to comprise a plurality of control buffers connected between the global lines and I/O pads, wherein control buffers connected to the two or more global lines connected to the selection unit from among the plurality of control buffers are controlled by the respective test output enable signals, and wherein the remaining control buffers are controlled by the output enable signal.

In an embodiment of the present invention, a semiconductor system includes a controller configured to transmit chip information unique to respective memory chips to the respective memory chips, and two or more memory chips electrically coupled by a semiconductor chip through line, wherein each of the memory chips comprises: a plurality of global lines configured to transmit a plurality of data stored in memory cells, a MUX unit configured to receive the plurality of data loaded onto the plurality of global lines to output a test data, a selection unit inserted into two or more of the plurality of global lines and configured to output the test data instead of the data loaded onto the two or more global lines, in a test mode, and an output unit coupled to the plurality of global lines and configured to output the plurality of data in a normal mode and to output the test data received from any one of the two or more global lines connected to the selection unit based on chip information in a test mode.

BRIEF DESCRIPTION OF THE DRAWINGS

Features, aspects, and embodiments are described in conjunction with the attached drawings, in which.

DETAILED DESCRIPTION

Hereinafter, a semiconductor device and a semiconductor system including the same according to the present invention will be described below with reference to the accompanying drawings through various embodiments.

Figure 1:
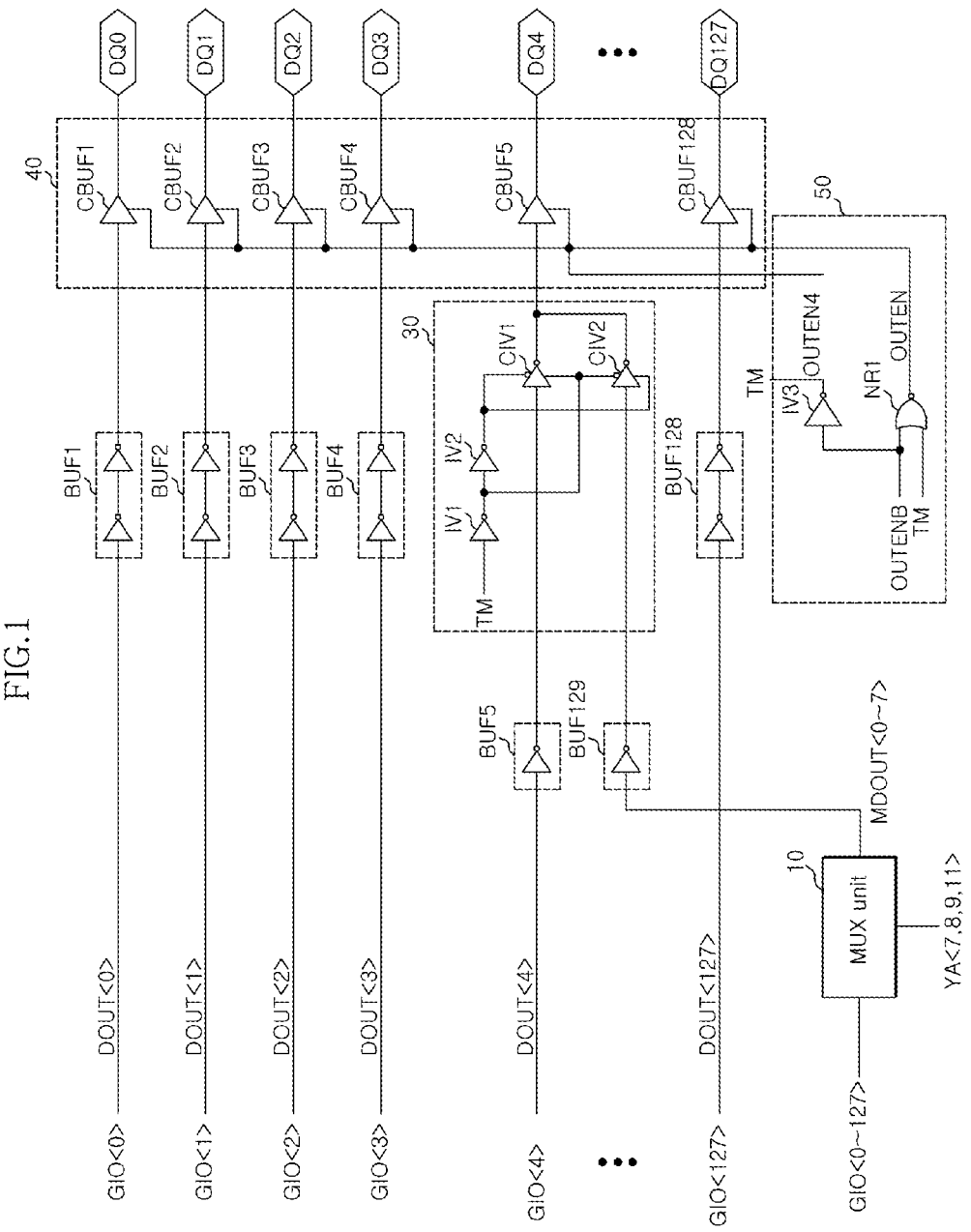
FIG. 1 is a circuit diagram of a semiconductor device according to an embodiment of the present invention.

FIG. 1 is a circuit diagram of a semiconductor device according to an embodiment of the present invention.

The semiconductor device of FIG. 1 according to the embodiment of the present invention is one semiconductor memory chip illustrating a data output path.

The semiconductor device includes a plurality of global lines GIO<0~127> configured to transmit data DOUT<0~127> stored in memory cells and an output unit 40 connected to the global lines GIO<0~127> and configured to drive data DOUT<0~127> to I/O pads DQ<0~127>. Buffers BUF1~BUF128 configured to transmit the data DOUT<0~127> may be included between the global lines GIO<0~127> and output unit 40.

For the purpose of a memory cell test, the semiconductor device may further include a MUX unit 10, a selection unit 30, and a control unit 50.

The MUX unit 10 receives the data DOUT<0~127> loaded onto the respective global lines GIO<0~127>. The MUX unit 10 selects the received data DOUT<0~127> and outputs test data MDOUT<0~7>, in response to column addresses YA<7, 8, 9, 11>.

Particularly, MUX unit 10 includes a MUX configured to classify global lines GIO<0~127> into respective groups, each having a specific number, and to output any one of the data DOUT loaded onto the global lines GIO as one of the test data MDOUT for each group in response to the column addresses YA<7, 8, 9, 11>. In an embodiment of the present invention described in FIG. 1, the 128 global lines GIO<0~127> are classified into a total of 8 groups each including 16 global lines, and the 8 groups output the respective test data MDOUT<0~7>. Whether each group will select any one of data (for example, DOUT<0~15>) loaded onto the 16 global lines (for example, GIO<0~15>) to output as a test datum (for example, MDOUT<0>) is determined by the column addresses YA<7, 8, 9, 11> having 4 bits.

The selection unit 30 is connected to some global lines GIO configured to output the test datum MDOUT instead of the data DOUT in a test mode, selected from among the plurality of global lines GIO<0~127>. In a normal mode, the selection unit 30 transmits the data DOUT, loaded onto relevant global lines GIO, to the output unit 40, but in a test mode, the selection unit 30 transmits the test data MDOUT, outputted from the MUX unit 10, to the output unit 40 instead of the data DOUT loaded onto relevant global lines GIO.

In the embodiment of FIG. 1, the number of selection units 30 is 8 because the number of test data MDOUT<0~7> is 8. As shown, one of the 8 selection units 30 is connected to the fifth global line GIO<4>. Particularly, the selection unit 30 includes first and second inverters IV1 and IV2 configured to output a test mode signal TM or an inverted test mode signal TM. The selection unit 30 may include first and second control inverters CIV1 and CIV2 configured to select and output the fifth datum DOUT<4> or the first test datum MDOUT<0> depending on the state of the test mode signal TM. Here, a buffer BUF129 configured to buffer the first test datum MDOUT<0> may be further included.

A detailed operation is described below. When the test mode signal TM is deactivated, the fifth datum DOUT<4> is selected and outputted because the first control inverter CIV1 is activated. In contrast, when the test mode signal TM is activated, the first test datum MDOUT<0> is selected and outputted because the second control inverter CIV2 is activated. For second to eighth test data MDOUT<1~7>, relevant data may be selected and outputted according to the same logic.

The output unit 40 includes a plurality of control buffers CBUF1~CBUF128 connected to the respective global lines GIO<0~127>. In a normal mode, all the control buffers CBUF1~CBUF128 are activated and configured to output all the data DOUT<0~127> to the I/O pads DQ<0~127>. In a test mode, only a control buffer that receives one of the test data MDOUT<0~7> is activated and configured to output one of the test data MDOUT<0~7>, and all the remaining control buffers are deactivated. As shown, only the fifth control buffer CBUF5 that outputs the first test datum MDOUT<0> is activated, and all the remaining control buffers CBUF1~CBUF4 and CBUF6~CBUF16 are deactivated.

The control unit 50 generates an output enable signal OUTEN and a test output enable signal OUTEN4 for controlling whether the control buffers CBUF1~CBUF128 of the output unit 40 will be activated or not. The output enable signal OUTEN controls the remaining control buffers that do not receive the test data MDOUT<0~7>, and the test output enable signal OUTEN4 controls a control buffer that receives the test data MDOUT<0~7>.

The output enable signal OUTEN is activated only in a normal mode and deactivated in a test mode. In contrast, the test output enable signal OUTEN4 is activated both in the normal mode and the test mode. Particularly, the control unit 50 may include a first NOR gate NR1 configured to generate the output enable signal OUTEN in response to an output control signal OUTENB and the test mode signal TM, and a third inverter IV3 configured to generate the test output enable signal OUTEN4 in response to the output control signal OUTENB. The output control signal OUTENB is activated when the semiconductor device performs an output operation.

The semiconductor device according to the embodiment of the present invention outputs the data DOUT<0~127> to the respective I/O pads DQ<0~127> in a normal mode and outputs each of the test data MDOUT<0~7> through a specific I/O pad (for example, DQ<4>) corresponding to the number of test data in a test mode. According to the present embodiment, in the test mode, the eight test data MDOUT<0~7> may be outputted through relevant eight I/O pads. Here, if the column addresses YA<7, 8, 9, 11> are alternately selected, all the 128 data DOUT<0~127> may be read out through 16 read operations.

As the processing capacity and processing speed of a semiconductor device improve, a system-in package in which a plurality of semiconductor devices is packaged into one has been developed. The system-in package is externally recognized as a single semiconductor device, but is internally operated as a single system in which the plurality of semiconductor devices is interconnected. For memory, a system-in package may be fabricated by interconnecting a plurality of memory chips and a controller.

Figure 2:
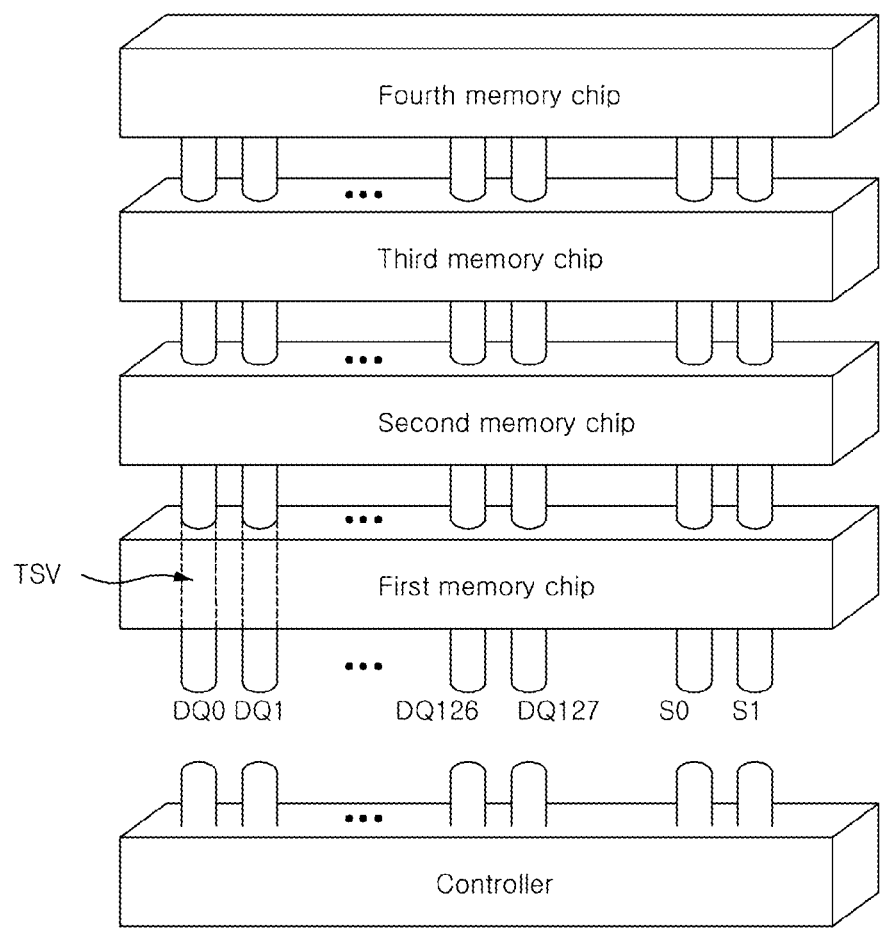
FIG. 2 is a diagram showing a semiconductor system according to an embodiment of the present invention.

FIG. 2 is a diagram showing a semiconductor system according to an embodiment of the present invention. In FIG. 2, the semiconductor system includes a controller and first to fourth memory chips. The first to fourth memory chips are electrically coupled so that the controller can control the first to fourth memory chips. A semiconductor chip through line is used to transfer a signal to a plurality of memory chips simultaneously. In general, the semiconductor chip is fabricated using a silicon wafer, and thus the semiconductor chip through line is also referred to as a Through Silicon Via (TSV). The first memory chip placed at the bottom in FIG. 2 is connected to the controller through a plurality of I/O pads DQ0~127 and S<0:1>.

A memory cell test is performed on a semiconductor device including a plurality of memory chips in a package state as described above. In case of the above-described single memory chip, a test is performed using a method of outputting test data, generated from one memory chip, through specific I/O pads. If this method is applied to a multi-chip package without adaptation, there lies a problem in that the time taken to perform a test is greatly increased because the next memory chip must be tested after one memory chip has been tested. Accordingly, there is a need for a method capable of testing a plurality of stacked memory chips at the same time.

Figure 3:
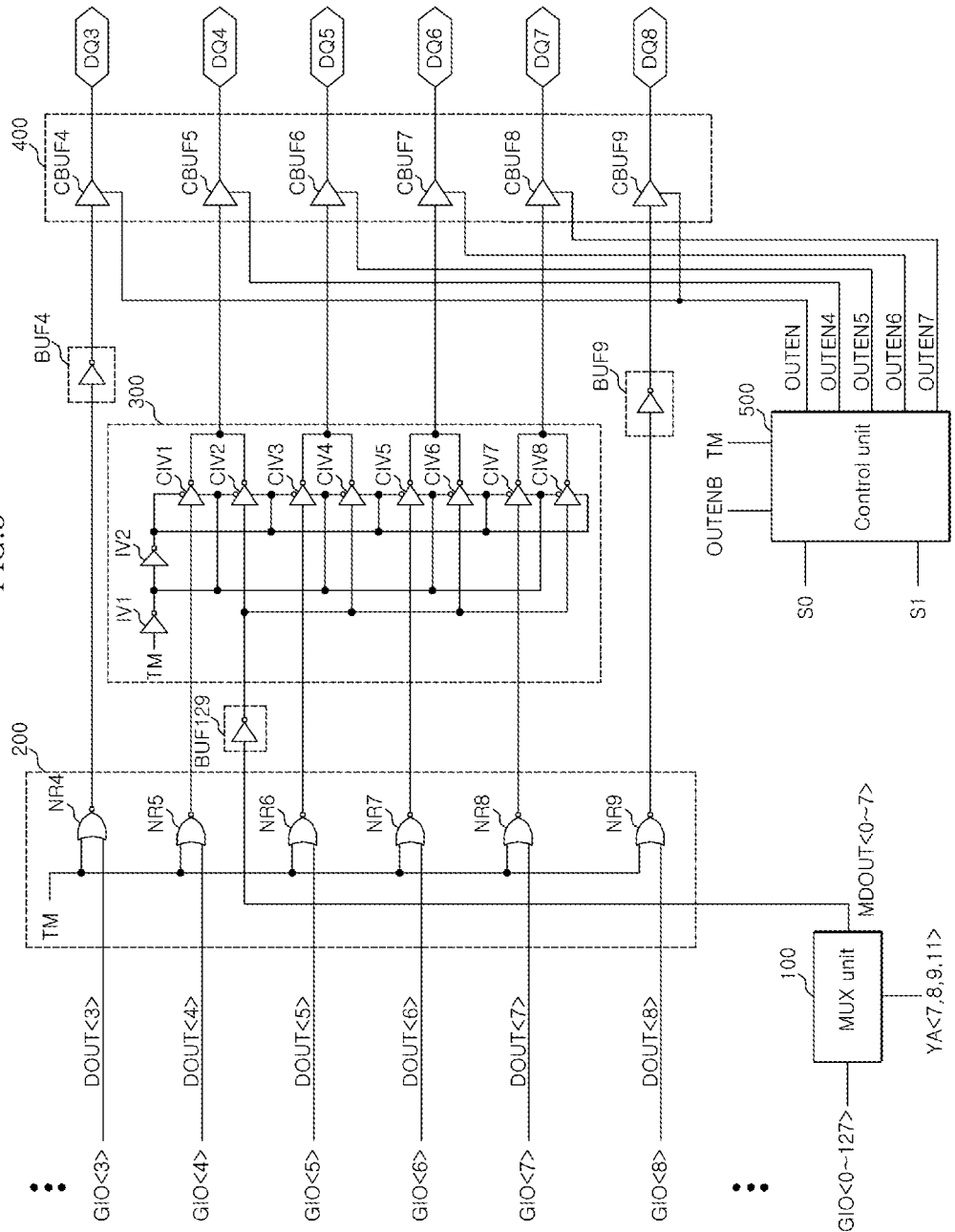
FIG. 3 is a circuit diagram showing a detailed embodiment of the first memory chip shown in FIG. 2.

FIG. 3 is a circuit diagram showing a detailed embodiment of the first memory chip configured to test a plurality of stacked memory chips at the same time. The construction and operation of a memory chip according to the present embodiment may be applied to all stacked memory chips in addition to the first memory chip.

The first memory chip shown in FIG. 3 includes a plurality of global lines GIO<0~127> configured to transmit respective data DOUT<0~127> stored in memory cells and an output unit 400 connected to the global lines GIO<0~127> and configured to drive the data DOUT<0~127> to respective I/O pads DQ<0~127>. Buffers BUF1~BUF128 for transmitting the respective data DOUT<0~127> may be further included between the global lines GIO<0~127> and the output unit 400.

For a memory cell test, the semiconductor device may further include a MUX unit 100, a selection unit 300, and a control unit 500.

The MUX unit 100 receives the data DOUT<0~127> loaded onto the global lines GIO<0~127>. The MUX unit 100 selects the received data DOUT<0~127> and outputs test data MDOUT<0~7> in response to column addresses YA<7, 8, 9, 11>.

Figure 4:
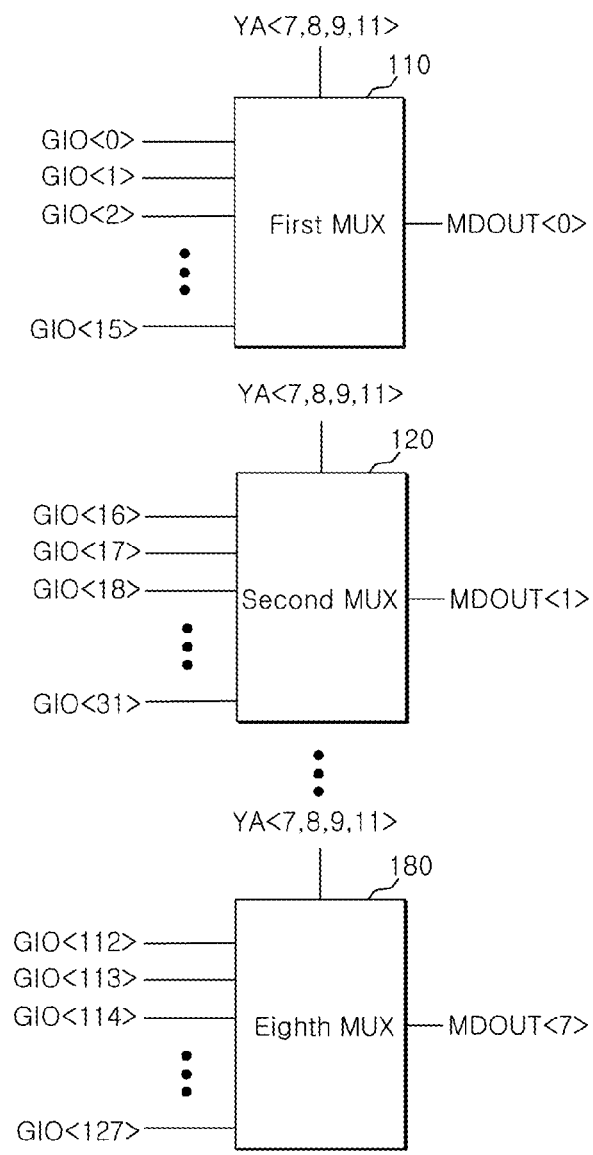
FIG. 4 is a block diagram showing a detailed embodiment of the MUX unit shown in FIG. 3.

Particularly, MUX unit 100 includes first to eighth MUXes 110~180 configured to classify global lines GIO<0~127> into respective groups, each having a specific number, and each to output any one of the data DOUT loaded onto relevant global lines GIO as a relevant test datum MDOUT in response to the column addresses YA<7, 8, 9, 11>, as shown in FIG. 4. In the present embodiment, the 128 global lines GIO<0~127> are classified into a total of 8 groups each including 16 global lines, and the 8 groups output the respective test data MDOUT<0~7>. For example, in case of the first MUX 110, whether the first MUX 110 will select any one of data DOUT<0~15> loaded onto the 16 global lines GIO<0~15> to output the selected datum as the test datum MDOUT<0> is determined by the column addresses YA<7, 8, 9, 11> having 4 bits.

The selection unit 300 is connected to some of the global lines GIO configured to output the test data MDOUT instead of the data DOUT in a test mode, selected from among the plurality of global lines GIO<0~127>. In a normal mode, the selection unit 300 transmits the data DOUT, loaded onto relevant global lines GIO, to the output unit 400 without change, but in a test mode, the selection unit 300 transmits the test data MDOUT, outputted from the MUX unit 100, to the output unit 400 instead of the data DOUT loaded onto relevant global lines GIO.

The number of selection units 300 according to the embodiment shown in FIG. 3 is 8 because the number of test data MDOUT<0~7> is 8. Unlike the embodiment shown in FIG. 1, each of the selection units 300 is connected to some global lines GIO equal to the number of stacked memory chips. In the present embodiment, since the four memory chips are stacked, the selection unit 300 for receiving the first test datum MDOUT<0> is connected to the fifth to eighth global lines GIO<4~7>, as shown in FIG. 3. Likewise, each of the selection units 300 configured to receive the second to eighth test data MDOUT<1~7>, respectively, will be connected to four global lines GIO.

Particularly, the selection unit 300 includes first and second inverters IV1 and IV2 configured to output a test mode signal TM or an inverted test mode signal TM. The selection unit 300 may include first and second control inverters CIV1 and CIV2 configured to select and output the fifth datum DOUT<4> or the first test datum MDOUT<0> depending on the state of the test mode signal TM, third and fourth control inverters CIV3 and CIV4 configured to select and output the sixth datum DOUT<5> or the first test datum MDOUT<0> depending on the state of the test mode signal TM, fifth and sixth control inverters CIV5 and CIV6 configured to select and output the seventh datum DOUT<6> or the first test datum MDOUT<0> depending on the state of the test mode signal TM, and seventh and eighth control inverters CIV7 and CIV8 configured to select and output the eighth data DOUT<7> or the first test datum MDOUT<0> depending on the state of the test mode signal TM. Here, a buffer BUF129 configured to buffer the first test datum MDOUT<0> may be further included.

A detailed operation is described below. When the test mode signal TM is deactivated, the fifth to eighth data DOUT<4~7> are selected and outputted because the first, third, fifth, and seventh control inverters CIV1, CIV3, CIV5, and CIV7 are activated. In contrast, when the test mode signal TM is activated, the first test datum MDOUT<0> is selected and outputted because the second, fourth, sixth, and eight control inverters CIV2, CIV4, CIV6, and CIV8 are activated. In case of the second to eighth test data MDOUT<1~7>, relevant data may be selected and outputted according to the same logic.

The output unit 400 includes a plurality of control buffers CBUF1~CBUF128 connected to the respective global lines GIO<0~127>. In a normal mode, all the control buffers CBUF1~CBUF128 are activated and configured to output all the data DOUT<0~127> to the I/O pads DQ<0~127>. In a test mode, only control buffers that receive the test data MDOUT<0~7> are activated and configured to output the test data MDOUT<0~7>, and all the remaining control buffers are deactivated. As shown, only the fifth to eighth control buffers CBUF5~CBUF8 for outputting the first test datum MDOUT<0> are activated, but all the remaining control buffers CBUF1~CBUF4 and CBUF9~CBUF16 are deactivated. Likewise, the second to eighth test data MOUT<1~7> are controlled.

The control unit 500 generates an output enable signal OUTEN and a plurality of test output enable signals OUTEN4~OUTEN7 for controlling whether the control buffers CBUF1~CBUF128 of the output unit 400 will be activated or not. The output enable signal OUTEN controls the remaining control buffers that do not receive the test data MDOUT<0~7>. In contrast, the plurality of test output enable signals OUTEN4~OUTEN7 control control buffers that receive the test data MDOUT<0~7>. In a test mode, the test output enable signals OUTEN4~OUTEN7 are activated based on respective memory chips.

The output enable signal OUTEN is activated only in a normal mode and deactivated in a test mode. In contrast, the test output enable signals OUTEN4~OUTEN7 are activated both in the normal mode and the test mode. The control unit 500 receives chip information S<0:1> from the controller to generate the output enable signal OUTEN and the plurality of test output enable signals OUTEN4~OUTEN7 in response to the output control signal OUTENB and the state of the test mode signal TM. Here, the chip information S<0:1> received from the controller are differently set in memory chips, and each of the chip information S<0:1> is unique to each memory chip. An output control signal OUTENB is activated when the semiconductor device performs an output operation.

Figure 5:
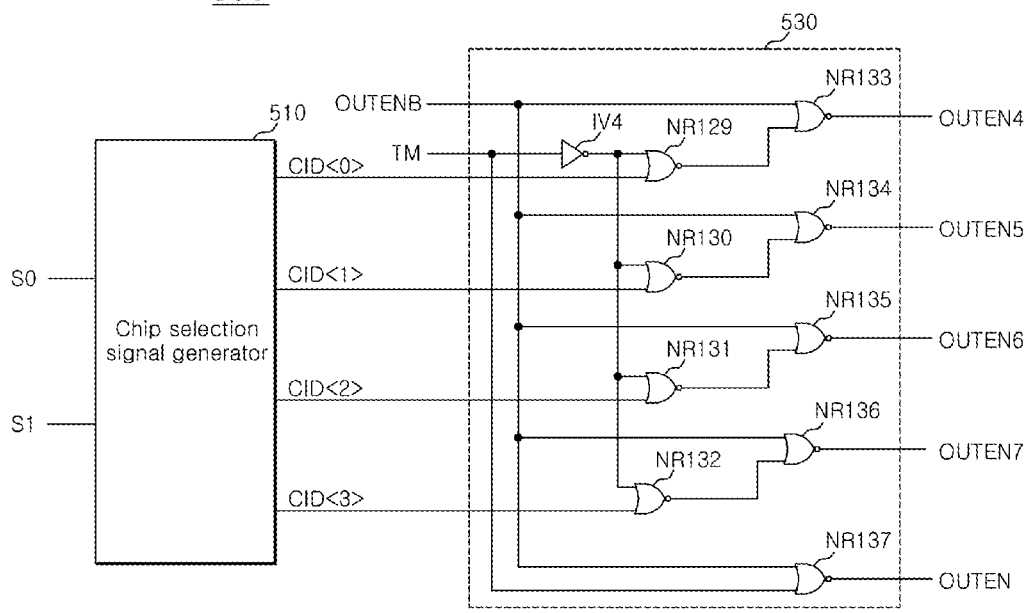
FIG. 5 is a circuit diagram showing a detailed embodiment of the control unit shown in FIG. 3.

Particularly, the control unit 500 includes a chip selection signal generator 510 and an output enable signal generator 530 as shown in FIG. 5.

The chip selection signal generator 510 decodes the chip information S<0:1> into first to fourth chip selection signals CID<0~3>. Accordingly, in a specific memory chip, only a specific chip selection signal CID according to chip information S unique to the specific memory chip is activated.

The output enable signal generator 530 generates the output enable signal OUTEN and the first to fourth test output enable signals OUTEN4~OUTEN7, corresponding to the first to fourth chip selection signals CID<0~3>, in response to the output control signal OUTENB and the test mode signal TM.

When the test mode signal TM is deactivated in the state in which the output control signal OUTENB has been activated, the output enable signal OUTEN and the first to fourth test output enable signals OUTEN4~OUTEN7 are activated. Accordingly, all the control buffers CBUF1~CBUF128 of the output unit 400 are activated, and thus the data DOUT<0~127> is outputted to the respective I/O pads DQ<0~127>.

In contrast, when the test mode signal TM is activated in the state in which the output control signal OUTENB has been activated, the output enable signal OUTEN is deactivated, and each of the first to fourth test output enable signals OUTEN4~OUTEN7 is activated in response to the activation state of each of the chip selection signals CID<0~3>. For example, in case of the first memory chip, the first test output enable signal OUTEN4 is activated. In case of the second memory chip, the second test output enable signal OUTEN5 is activated. In case of the third memory chip, the third test output enable signal OUTEN6 is activated. In case of the fourth memory chip, the fourth test output enable signal OUTEN7 is activated.

Particularly, the output enable signal generator 530 may include an inverter IV4 and a plurality of NOR gates NR129~NR137.

The inverter IV4 inverts the test mode signal TM and outputs the inverted test mode signal TM.

The first to fourth NOR gates NR129~NR132 receive the inverted test mode signal TM and the first to fourth chip selection signals CID<0~3>, respectively.

The fifth to eighth NOR gates NR133~NR136 generate the first to fourth test output enable signals OUTEN4~OUTEN7 in response to the output control signal OUTENB and the respective output signals of the first to fourth NOR gates NR129~NR132.

The ninth NOR gate NR137 generates the output enable signal OUTEN in response to the output control signal OUTENB and the test mode signal TM.

Accordingly, when the test mode signal TM is deactivated in the state in which the output control signal OUTENB has been activated, all the output enable signal OUTEN and the first to fourth test output enable signals OUTEN4~OUTEN7 are activated. In contrast, when the test mode signal TM is activated in the state in which the output control signal OUTENB has been activated, the output enable signal OUTEN is deactivated, and each of the test output enable signals OUTEN4~OUTEN7 is activated in response to the activation state of each of the chip selection signals CID<0~3>.

The memory chip shown in FIG. 3 may further include a blocking unit 200 for blocking the transmission of the data DOUT<0~127> from the global lines GIO<0~127> when the test mode signal TM is activated. Current consumption may be reduced because the driving of data in the global lines GIO<0~127> is blocked when a test mode is performed.

Particularly, the blocking unit 200 may include a plurality of NOR gates NR1~NR128. The NOR gates NR1~NR128 receive the test mode signal TM and the respective data DOUT<0~127> loaded onto the global lines GIO<0~127>.

Accordingly, the semiconductor device according to the embodiment of the present invention outputs the data DOUT<0~127> of one memory chip through the I/O pads DQ<0~127> in a normal mode and outputs the test data MDOUT<0~7> of all the stacked memory chips through the specific I/O pads DQ<4, 5, 6, 7>, corresponding to the number of test data, at the same time in a test mode. According to the present embodiment, in the test mode, the eight test data MDOUT<0~7> of the respective memory chips may be simultaneously outputted through the I/O pads. Here, by alternately selecting the column addresses YA<7, 8, 9, 11>, the 128 data DOUT<0~128> of each of the memory chips may be read out through 16 read operations.

While certain embodiments have been described above, it will be understood to those skilled in the art that the embodiments described are by way of example only. Accordingly, the semiconductor device and the semiconductor system including the same described herein should not be limited based on the described embodiments. Rather, the semiconductor device and the semiconductor system including the same described herein should only be limited in light of the claims that follow when taken in conjunction with the above description and accompanying drawings.

What is claimed is:

1. A semiconductor device, comprising:
two or more memory chips electrically coupled,
wherein each of the memory chips comprises:
a plurality of global lines configured to transmit a plurality of data stored in memory cells;
a MUX unit configured to receive the plurality of data loaded onto the plurality of global lines to output a test data;
a selection unit inserted into two or more of the plurality of global lines and configured to output the test data instead of the data loaded onto the two or more global lines, in a test mode; and
an output unit coupled to the plurality of global lines and configured to output the plurality of data in a normal mode, and to output the test data received from any one of the two or more global lines coupled to the selection unit based on information about the memory chip in the test mode.

2. The semiconductor device according to claim 1, wherein the output units of the respective memory chips are electrically connected to I/O pads in common.

3. The semiconductor device according to claim 2, further comprising a blocking unit configured to block the transmission of the data of the plurality of global lines in the test mode.

4. The semiconductor device according to claim 2, wherein:
the output unit comprises a plurality of control buffers connected to the respective global lines, and
in the test mode, a control buffer for receiving the test data from among the plurality of control buffers is enabled, and all remaining control buffers are disabled.

5. The semiconductor device according to claim 1, wherein the memory chips are electrically coupled by a semiconductor chip through line and stacked.

6. A semiconductor device, comprising:
two or more memory chips electrically coupled,
wherein each of the memory chips comprises:
a plurality of global lines configured to transmit a plurality of data stored in memory cells;
a MUX unit configured to receive the plurality of data loaded onto the plurality of global lines to output a test data;
a selection unit inserted into two or more of the plurality of global lines and configured to output the test data instead of the data loaded onto the two or more global lines, in a test mode;
a control unit configured to generate an output enable signal and two or more test output enable signals based on received chip information in response to a test mode signal; and
an output unit configured to comprise a plurality of control buffers connected between the global lines and I/O pads, wherein control buffers connected to the two or more global lines connected to the selection unit from among the plurality of control buffers are controlled by the respective test output enable signals, and remaining control buffers are controlled by the output enable signal.

7. The semiconductor device according to claim 6, wherein the memory chips share the I/O pads.

8. The semiconductor device according to claim 7, wherein the memory chips receive unique chip information.

9. The semiconductor device according to claim 7, further comprising a blocking unit configured to block the transmission of the data of the plurality of global lines when the test mode signal is activated.

10. The semiconductor device according to claim 7, wherein the control unit comprises:
   a chip selection signal generator configured to decode the chip information into a plurality of chip selection signals; and
   an output enable signal generator configured to generate the output enable signal and the test output enable signals corresponding to the respective chip selection signals, in response to the plurality of chip selection signals and the test mode signal.

11. The semiconductor device according to claim 10, wherein the chip selection signal generator activates a chip selection signal corresponding to a relevant memory chip, from among the plurality of chip selection signals.

12. The semiconductor device according to claim 10, wherein:
   when the test mode signal is deactivated, the output enable signal generator activates the output enable signal and the test output enable signals, and
   when the test mode signal is activated, the output enable signal generator deactivates the output enable signal and activates each of the test output enable signals in response to an activation state of each of the chip selection signals.

13. The semiconductor device according to claim 7, wherein the MUX unit comprises a plurality of MUXes configured to classify the plurality of global lines into groups, and each MUX configured to output one of the data loaded onto the global lines as one of the test data in response to column addresses.

14. The semiconductor device according to claim 13, wherein a plurality of the selection units receives the respective test data from a plurality of the MUX units.

15. The semiconductor device according to claim 14, wherein a plurality of the output units receives the respective test data based on the respective selection units.

16. The semiconductor device according to claim 7, wherein the memory chips are electrically coupled by a semiconductor chip through line and stacked.

17. A semiconductor system, comprising:
   a controller configured to transmit chip information unique to respective memory chips to the respective memory chips; and
   two or more memory chips electrically coupled by a semiconductor chip through line,
   wherein each of the memory chips comprises:
   a plurality of global lines configured to transmit a plurality of data stored in memory cells;
   a MUX unit configured to receive the plurality of data loaded onto the plurality of global lines to output a test data;
   a selection unit inserted into two or more of the plurality of global lines and configured to output the test data instead of the data loaded onto the two or more global lines, in a test mode; and
   an output unit coupled to the plurality of global lines and configured to output the plurality of data in a normal mode and output the test data received from any one of the two or more global lines connected to the selection unit based on the chip information in the test mode.

18. The semiconductor system according to claim 17, wherein the memory chips share the I/O pads.

19. The semiconductor system according to claim 18, further comprising a blocking unit configured to block the transmission of the data of the plurality of global lines in the test mode.

20. The semiconductor system according to claim 19, wherein:
   the output unit comprises a plurality of control buffers connected to the respective global lines, and
   in the test mode, control buffers for receiving the test data from among the plurality of control buffers are enabled and remaining control buffers are disabled.

* * * * *